United States Patent
Goh et al.

(10) Patent No.: US 8,766,426 B2
(45) Date of Patent: Jul. 1, 2014

(54) INTEGRATED CIRCUIT PACKAGING SYSTEM WITH WARPAGE CONTROL AND METHOD OF MANUFACTURE THEREOF

(75) Inventors: Hin Hwa Goh, Singapore (SG); Xusheng Bao, Singapore (SG); Yung Kuan Hsiao, Singapore (SG); Kang Chen, Singapore (SG); Rui Huang, Singapore (SG)

(73) Assignee: STATS ChipPac Ltd., Singapore (SG)

( * ) Notice: Subject to any disclaimer, the term of this patent is extended or adjusted under 35 U.S.C. 154(b) by 148 days.

(21) Appl. No.: 12/890,161

(22) Filed: Sep. 24, 2010

(65) Prior Publication Data

US 2012/0074560 A1 Mar. 29, 2012

(51) Int. Cl.
*H01L 23/02* (2006.01)

(52) U.S. Cl.
USPC .......................................... 257/690; 438/121

(58) Field of Classification Search
USPC .......... 257/678, 690, 727, 734, 778, E23.179, 257/E23.18, E23.181
See application file for complete search history.

(56) References Cited

U.S. PATENT DOCUMENTS

| | | | | |
|---|---|---|---|---|
| 4,445,735 A * | 5/1984 | Bonnefoy | | 439/66 |
| 4,611,869 A * | 9/1986 | Bonnefoy | | 439/373 |
| 4,975,637 A * | 12/1990 | Frankeny et al. | | 324/750.11 |
| 5,371,652 A * | 12/1994 | Clemens et al. | | 361/704 |
| 5,650,913 A * | 7/1997 | Kochanski | | 361/704 |
| 5,739,053 A * | 4/1998 | Kawakita et al. | | 438/108 |
| 5,811,317 A * | 9/1998 | Maheshwari et al. | | 29/827 |
| 6,015,081 A * | 1/2000 | Okabayashi et al. | | 228/180.22 |
| 6,281,592 B1 * | 8/2001 | Murayama | | 257/796 |
| 6,429,384 B1 * | 8/2002 | Downes et al. | | 174/260 |
| 6,654,250 B1 * | 11/2003 | Alcoe | | 361/719 |
| 6,828,676 B2 * | 12/2004 | Akai | | 257/720 |
| 6,949,404 B1 * | 9/2005 | Fritz et al. | | 438/106 |
| 6,977,434 B2 * | 12/2005 | Martino | | 257/727 |
| 7,009,307 B1 * | 3/2006 | Li | | 257/783 |
| 7,459,782 B1 | 12/2008 | Li | | |
| 7,538,432 B1 | 5/2009 | Danovitch et al. | | |
| 2002/0155637 A1 * | 10/2002 | Lee | | 438/108 |
| 2004/0159956 A1 * | 8/2004 | Boone et al. | | 257/778 |
| 2005/0068752 A1 * | 3/2005 | Hashimoto et al. | | 361/784 |
| 2005/0133895 A1 * | 6/2005 | Ujiie et al. | | 257/678 |
| 2006/0033214 A1 * | 2/2006 | Tomono | | 257/772 |
| 2007/0184582 A1 * | 8/2007 | Nakamura et al. | | 438/108 |
| 2008/0006926 A1 * | 1/2008 | Bathan et al. | | 257/689 |
| 2009/0035894 A1 * | 2/2009 | Bone | | 438/121 |
| 2009/0168390 A1 | 7/2009 | Lehman, Jr. et al. | | |
| 2010/0102435 A1 * | 4/2010 | Ryan et al. | | 257/692 |

* cited by examiner

*Primary Examiner* — Michele Fan
(74) *Attorney, Agent, or Firm* — Ishimaru & Associates LLP (57) ABSTRACT

A method of manufacture of an integrated circuit packaging system includes: providing a carrier; mounting an integrated circuit device having component connectors directly on the carrier; placing a restraint structure over the integrated circuit device for controlling warpage of the integrated circuit device during bonding of the component connectors to the carrier causing some of the component connectors to separate from the carrier; and bonding all of the component connectors to the carrier.

18 Claims, 5 Drawing Sheets

INTEGRATED CIRCUIT PACKAGING SYSTEM WITH WARPAGE CONTROL AND METHOD OF MANUFACTURE THEREOF

TECHNICAL FIELD

The present invention relates generally to an integrated circuit packaging system, and more particularly to a system with warpage control.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a carrier; mounting an integrated circuit device having component connectors directly on the carrier; placing a restraint structure over the integrated circuit device for controlling warpage of the integrated circuit device during bonding of the component connectors to the carrier causing some of the component connectors to separate from the carrier; and bonding all of the component connectors to the carrier.

The present invention provides an integrated circuit packaging system, including: a carrier; and an integrated circuit device having all component connectors bonded to the carrier and connected to the integrated circuit device having contact marks characteristic of a restraint structure, to control warpage of the integrated circuit device and prevent separation of the component connectors from the carrier, removed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
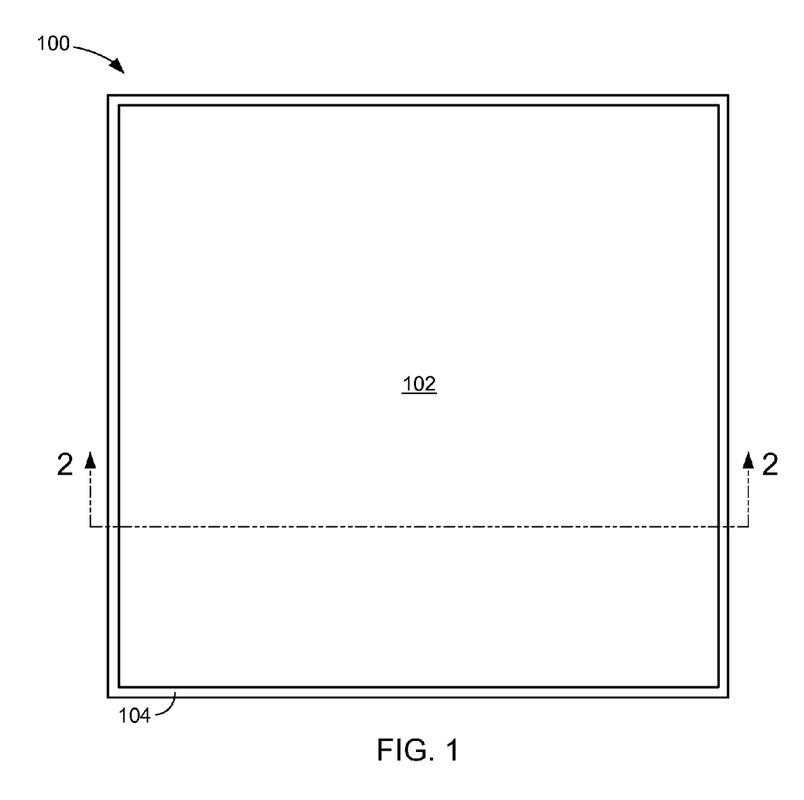
FIG. 1 is a top view of an integrated circuit packaging system in a first embodiment of the present invention.

Referring now to FIG. 1, therein is shown a top view of an integrated circuit packaging system 100 in a first embodiment of the present invention. The integrated circuit packaging system 100 is shown with a restraint structure 102 over a carrier 104.

The carrier 104 can include conductive materials (not shown) on and within the carrier 104 to provide electrical connectivity between the integrated circuit packaging system 100 and a next level of integration (not shown). The restraint structure 102 is shown centrally position over the carrier 104.

Figure 2:
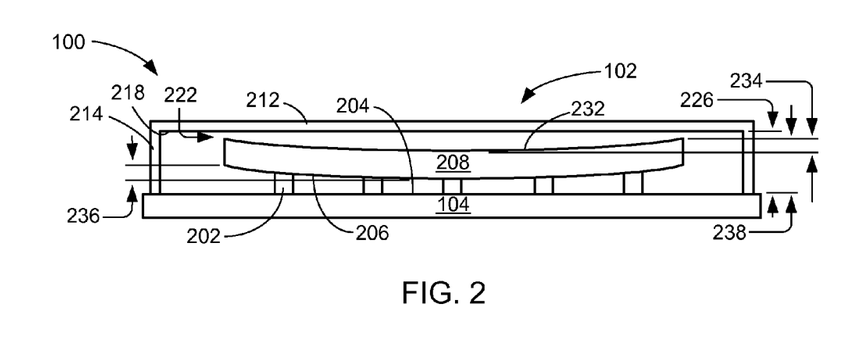
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The integrated circuit packaging system 100 includes component connectors 202 bonded or attached to a component side 204 of the carrier 104 and to an active side 206 of an integrated circuit device 208 or flip chip facing the component side 204. The active side 206 is defined as a side of the integrated circuit device 208 having active circuitry fabricated thereon or having elements for connection to the active circuitry within the integrated circuit device 208.

The restraint structure 102 is formed having a cover lid 212 or frame intersecting and suspended by support sides 214. The restraint structure 102 is formed from a low coefficient of thermal expansion material (low CTE material) that can include a material having ceramic properties, magnetic properties, conductive properties, or any combination thereof. The restraint structure can be formed having physical properties that can include a specific mass, dimension, shape, density, or material property and pre-determined using a process described in the FIG. 6 description.

For example, the restraint structure 102 can be formed from materials having ferromagnetic properties that can include iron, cobalt, nickel, and their alloys or in combination with aluminum, platinum, magnesium, molybdenum, lithium, or tantalum with a specific mass and dimensions.

The cover lid 212 is shown as covering the entire area between the support sides 214, although it is understood that the cover lid 212 can be hooks, tabs, a partial frame, or any other shape capable of restraining the integrated circuit device 208. The cover lid 212 can be formed with multiple sections or with open sections.

The cover lid 212 or frame can be made in a form of a strip or a wafer and based on application usage or the carrier 104. The restraint structure 102 can be placed over the integrated circuit device 208 with the component connectors 202 directly on the conductive materials of the carrier 104. The restraint structure 102 is placed or held in a rest position on the component side 204 using a force.

The force can be a result of a weight of the restraint structure 102, an external weight applied to the restraint structure 102, an electromagnetic force applied to the restraint structure 102, a fastened force, or any combination thereof.

The force can be applied for holding the restraint structure 102 in the rest position by weight of the restraint structure 102. The force can also be applied for holding the restraint structure 102 in the rest position by electromagnetic force. The force can further be applied for holding the restraint structure 102 in the rest position by fastened force.

The weight of an element is defined as a force exerted to the element towards Earth that is equal to a mathematical product of the mass of the element and of a gravitational acceleration of the Earth acting on the element.

The external force can include a clamping fixture (not shown) or an object (not shown) placed on the restraint structure 102 having a specific weight determined by its mass to maintain the physical contact to the component side 204. The fastened force is defined as a structural joining of the support sides 214 with the component side 204 that can include an adhesive force, a solder bonding force, a weld joining force, a mechanical based fastener, or any combination thereof.

The support sides 214 can surround an outside perimeter of the integrated circuit device 208. It is understood that the support sides 214 can surround portions of the outside perimeter, as an example. The support sides 214 can be formed along two opposing sides of a perimeter enclosing the integrated circuit device 208, as another example.

The cover lid 212 or frame includes an inner confinement surface 218 that faces the integrated circuit device 208. The inner confinement surface 218 can preferably be parallel to the carrier 104 and can optionally be in direct contact with the carrier 104 before any elevated temperature processing occurs.

The inner confinement surface 218 of the cover lid 212 or frame is used to limit movement or warping, during elevated temperature processes, of any portion of the integrated circuit device 208 away from the carrier 104 to prevent the component connectors 202 from lifting off of the carrier 104. The component connectors 202 remain connected between the integrated circuit device 208 and the carrier 104 during and after the elevated temperature processes that can include a reflow or bonding process, a burn-in process, or thermal cycling processes, can create a warpage of the integrated circuit device 208.

Figure 5:
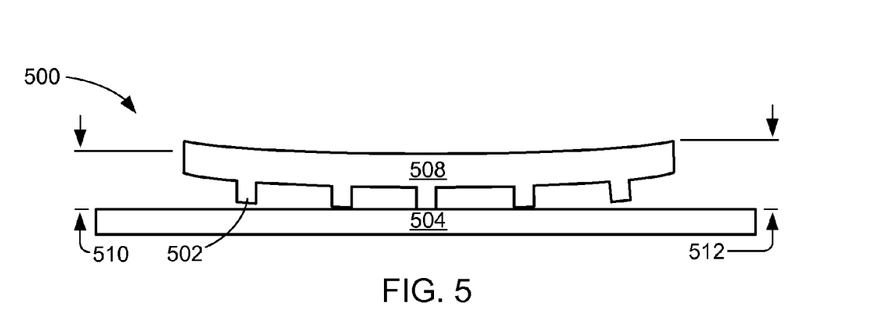
FIG. 5 is a cross-sectional view of an integrated circuit packaging system in a fourth embodiment of the present invention in a warpage characterization phase.

Any warpage of the integrated circuit device 208 results in a direct contact of the inner confinement surface 218 with the integrated circuit device 208 before a threshold warpage 510 of FIG. 5. The force acting on the cover lid 212 or frame prevents separation or lifting of the integrated circuit device 208 from the carrier 104 resulting in all of the component connectors 202 having continued connectivity between the integrated circuit device 208 and the carrier 104.

The force acting on the cover lid 212 or frame also limits or control the warpage of the integrated circuit device 208. The inner confinement surface 218 in direct contact with the integrated circuit device 208 results in contact marks (not shown) having characteristics including scratches, friction marks, compression marks or indentations on an upper most edge of the integrated circuit device 208 and particularly on a perimeter of a surface of the cover lid 212 opposite the inner confinement surface 218.

The restraint structure 102 can be removed after the elevated temperature processes have completed by removal of the force applied to the restraint structure 102. The restraint structure 102 can optionally remain or left permanently mounted on the carrier 104 by a continued application of the force applied to the restraint structure 102.

It has been discovered that the restraint structure 102 on the carrier 104 eliminates open circuit failures and chip damage for example as a result of manufacturing process including heat such as a reflow process.

It has also been discovered that the restraint structure 102 can provide electromagnetic shielding of any components in the integrated circuit packaging system 100 including the integrated circuit device 208.

An expansion gap 222 can optionally separate the inner confinement surface 218 from the integrated circuit device 208 and occur before or after the integrated circuit packaging system 100 has been processed by any of the elevated temperature processes. The expansion gap 222 is defined as a space, an area, or a region, physically separating the inner confinement surface 218 from all or a portion of the integrated circuit device 208.

The expansion gap 222 can provide some upward movement of the integrated circuit device 208 before the integrated circuit device 208 contacts and is restrained by the inner confinement surface 218. The expansion gap 222 minimizes any stress applied to the integrated circuit device 208 due to any contact or restraint of the integrated circuit device 208 by the inner confinement surface 218.

It has been discovered that the expansion gap 222 and the restraint structure 102 provides structural integrity of or protection of the integrated circuit packaging system 100 from environmental damage or stress, particularly for the integrated circuit device 208.

It has also been discovered that the electromagnetic force applied to the restraint structure 102 eliminates product defects as a result of lateral shifting of the integrated circuit device 208 with respect to the carrier 104 during the elevated temperature processes.

An inner cover height 226 is defined as a maximum vertical distance from the component side 204 to the inner confinement surface 218. The inner cover height 226 can be used to form the physical separation provided of the expansion gap 222. Formation and specifications for the restraint structure 102 including the inner cover height 226 can be determined using a characterization process described in the FIG. 6 description.

The elevated temperatures can result in a permanent deformation or warpage of the integrated circuit device 208. For example, reduced die thickness and increased die sizes tend to warp more and more easily during assembly processes. The integrated circuit device 208 is shown with the permanent deformation of the active side 206 and of an inactive side 232 opposite the active side 206.

The permanent deformation is a result of temperature cycling during the assembly and manufacturing processing. The permanent deformation can include a curved deformation 234, an outward deformation 236, and a permanent peak height 238 of the integrated circuit device 208.

The outward deformation 236 can be formed on the active side 206 of the integrated circuit device 208 and have a convex shape. The curved deformation 234 can be formed on the inactive side 232 of the integrated circuit device 208 and have a concave shape.

A peak is defined as a point on an element side having a maximum vertical distance above any other point on the element side. A trough is defined as a point on an element side having a maximum vertical distance below any other point on the element side.

A deformation depth is defined as a maximum vertical distance between a peak of an element side and a trough of the element side. A deformation depth of the curved deformation 234 on the inactive side 232 can be equal to a deformation depth of the outward deformation 236 on the active side 206 resulting in minimal structural stress applied to sides of the integrated circuit device 208.

Undeformed is defined as a lack of or an absence of physical or structural change between the formation of the restraint structure 102 and usage of the restraint structure including placement, mounting, or exposure to the elevated temperatures. The restraint structure 102 is undeformed and immobile or fixed during and following exposure to the elevated temperatures.

The permanent peak height 238 is defined as a maximum vertical distance formed between the component side 204 and the peak of the inactive side 232 of the integrated circuit device 208 after manufacturing process and assembly steps have been completed. The component connectors 202 can be formed of conductive material or solder having reflow or bonding process capabilities and having cohesive properties capable of compression and elongation.

The present invention prevents or minimizes the permanent peak height 238 to eliminate lifting of the component connectors 202 from the carrier 104 as well as electrical shorting of the component connectors 202. The component connectors 202 can have any size, any shape, and be different in size or shape from one another. For example, one of the component connectors 202 can be a solder ball and another of the component connectors 202 can be a column of solder.

Figure 3:
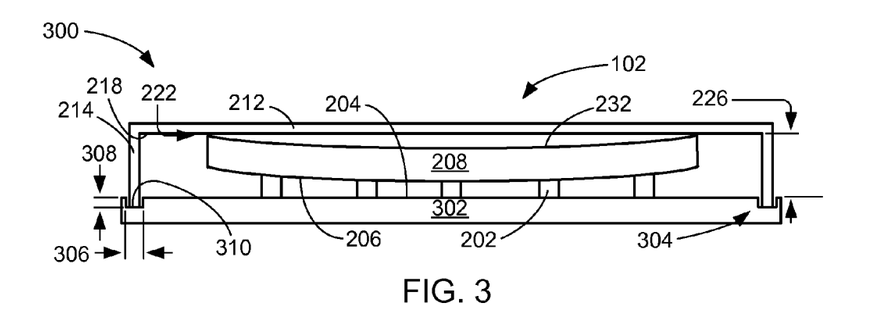
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 is similar to the integrated circuit packaging system 100 except the integrated circuit packaging system 300 includes a carrier 302.

The carrier 302 is similar to the carrier 104 of FIG. 2 except the carrier 302 includes a channel 304 or recess formed in the carrier 302. The channel 304 is formed under the support sides 214 and includes a channel width 306 and a channel depth 308.

The channel width 306 is defined as a minimum horizontal width of the channel 304. The channel width 306 can be greater than a maximum thickness of the support sides 214. The channel depth 308 is a vertical distance from the component side 204 to a horizontal surface 310 of the carrier 302 forming the channel 304. The horizontal surface 310 in the carrier 302 can preferably be flat and horizontal.

Ends of the support sides 214 opposite the cover lid 212 or frame of the restraint structure 102 are aligned and partially placed or held in the channel 304. The ends of the support sides 214 can be directly on the horizontal surface 310 in the channel 304. The channel 304 provides precise placement and alignment of the restraint structure 102 over the inactive side 232 of the integrated circuit device 208.

The restraint structure 102 can be temporarily positioned on the carrier 104 during the assembly and manufacturing processing and removed thereafter or permanently mounted on the carrier 104. The restraint structure 102 is placed or held in a rest position on the component side 204 using the force. Formation and specifications for the restraint structure 102 including the inner cover height 226 can be determined using a characterization process described in the FIG. 6 description.

The integrated circuit packaging system 300 also includes the component connectors 202 attached to the component side 204 and the active side 206 of the integrated circuit device 208. The channel depth 308 can be used to adjust or eliminate the expansion gap 222 or the inner cover height 226.

It has been discovered that the channel 304 and the restraint structure 102 eliminates connection shorts of the component connectors 202 at least due to lateral movement or shifting of the restraint structure 102.

It has been discovered that the channel 304 and the restraint structure 102 provides improved product reliability by eliminating contamination of the integrated circuit packaging system 300 at least between the support sides 214 surrounding the outside perimeter of the integrated circuit device 208 and the carrier 302.

Figure 4:
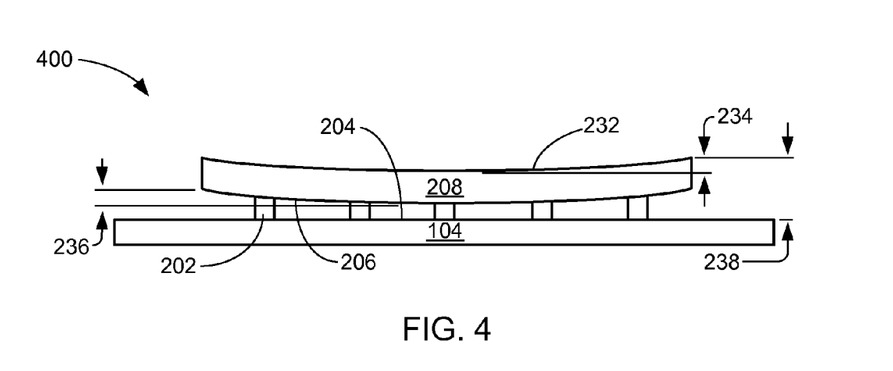
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can be similar to the integrated circuit packaging system 100 except the integrated circuit packaging system 300 is further processed to remove the restraint structure 102 of FIG. 2.

Figure 6:
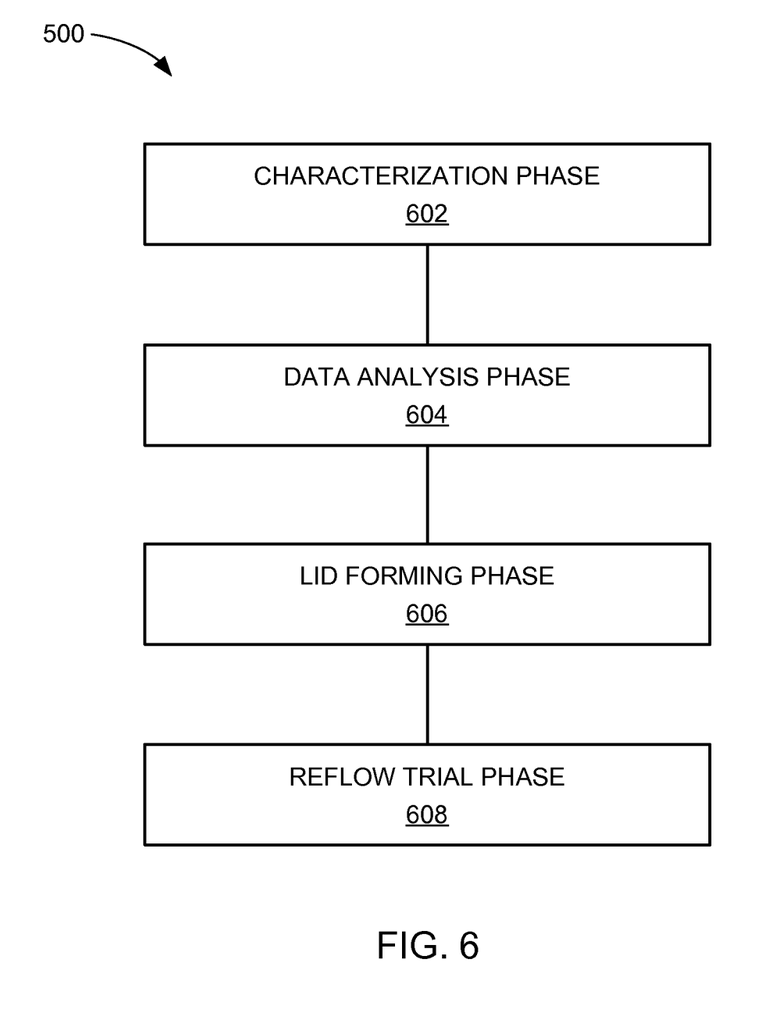
FIG. 6 is a flow chart of a restraint structure characterization process of the integrated circuit packaging system of FIG. 5.

Formation and specifications for the restraint structure 102 can be determined using a characterization process described in the FIG. 6 description. The restraint structure 102 can be removed after a manufacturing stage or a reflowing of the integrated circuit packaging system 400.

The integrated circuit packaging system 300 includes the component connectors 202 of the integrated circuit device 208 to be attached to the component side 204 of the carrier 104 using a reflow or bonding process. The curved deformation 234 of the inactive side 232 can preferably be equal to the outward deformation 236 of the active side 206. A maximum height of the integrated circuit packaging system 400 is equal to the permanent peak height 238.

It has been discovered that the restraint structure 102 over the integrated circuit device 208 eliminates open circuit failures during reflow processing or exposure to elevated temperatures.

It has been discovered that the restraint structure 102 over the integrated circuit device 208 eliminates short circuit failures during reflow processing or exposure to elevated temperatures.

Referring now to FIG. 5, therein is shown a cross-sectional view of an integrated circuit packaging system 500 in a fourth embodiment of the present invention in a warpage characterization phase. Shown are component connectors 502, a carrier 504, and an integrated circuit device 508 in the warpage characterization phase.

The component connectors 502, the carrier 504, and the integrated circuit device 508 can be similar to the component connectors 202 of FIG. 2, the carrier 104 of FIG. 2, and the integrated circuit device 208, respectively. The integrated circuit packaging system 500 can be exposed to temperature cycling and reflow processing steps without benefit of the restraint structure 102 of FIG. 2 to characterize physical characteristics and behavior of the integrated circuit packaging system 500.

The threshold warpage 510 is defined as a maximum vertical distance the integrated circuit device 508 can rise away from the carrier 504 before any of the component connectors 502 are electrically separated from the carrier 504 or the integrated circuit device 508. A peak warpage 512 is defined as a peak vertical distance the integrated circuit device 508 can rise away from the carrier 504 during the temperature cycling and reflow processing steps.

The threshold warpage 510 and the peak warpage 512 are measured and recorded during the temperature cycling and reflow processing phases needed for the manufacture of the integrated circuit packaging system 500. As an example, the temperature cycling and reflow processing can be used to characterize flip chip warpage and control limits before any open circuits occur.

Referring now to FIG. 6, therein is shown a flow chart of a restraint structure characterization process of the integrated circuit packaging system 500 of FIG. 5. The restraint structure characterization process includes a characterization phase 602, a data analysis phase 604, a lid forming phase 606, and a reflow trial phase 608.

The characterization phase 602 includes recording the threshold warpage 510 of FIG. 5 and the peak warpage 512 of FIG. 5 from representative spread of different integrated circuit packaging systems using a process identical to the warpage characterization phase described in FIG. 5. The threshold warpage 510, the peak warpage 512, for each combination of different die sizes and die thickness is recorded for processing in the data analysis phase 604.

The data analysis phase 604 includes a use of statistical processing to derive a representative value for the threshold warpage 510 and the peak warpage 512 for each combination of different die sizes and die thickness measured during the characterization phase 602. The threshold warpage 510 and the peak warpage 512 for each combination of die sizes and die thicknesses are recorded for further processing in the lid forming phase 606.

The lid forming phase 606 includes an analysis of statistically derived data generated during the data analysis phase 604 to determine, extrapolate, and specify proper physical properties needed to form a restraint structure or warpage restrainer for each user specified die size and die thickness combination. The proper physical properties of each of the restraint structures can include specification of dimensions, mass, material, and density.

The specification of dimensions can include inner cover heights, weights, geometries, thicknesses, and expansion gaps. Optionally, dimensions for channels in specific carriers can derived from the specification of the dimensions. The inner cover height 226 of FIG. 2 and the expansion gap 222 of FIG. 2 can be determined from the specification of dimensions generated during the lid forming phase 606. The proper physical properties insure that there is no damage to integrated circuit devices or flip chip dies as a result of the elevated temperature processes.

A forming process can be used to form each of the restraint structures or the warpage retainers and can include a cutting, a drilling, a sanding, or a planarization processes. The restraint structures can include a cover lid and support sides similar to the cover lid 212 or frame of FIG. 2 and the support sides 214 of FIG. 2, respectively. The restraint structures can be formed to be resistant to warpage or deformation by using a material or a material with characteristics that can include a low coefficient of thermal expansion.

The reflow trial phase 608 is used to confirm and validate characteristics and functionality of each of the restraint structures. The restraint structures are formed during the lid forming phase 606. The reflow trial phase 608 includes building, testing, and inspecting. Representative samples of integrated circuit packaging systems are used to validate that all of the component connectors have connectivity between the carrier and circuitry integrated circuit device after exposure to the elevated temperature processes.

The elevated temperature processes are identical to specific manufacturing build and assembly processes specific to each manufacturer. Failures or inconsistent results during the reflow trial phase 608 can be followed up with repeated sequences of the characterization phase 602, the data analysis phase 604, the lid forming phase 606, and the reflow trial phase 608 as needed.

It has been discovered that the restraint structure characterization process provides a method for assembling of flip chip assemblies using a restraint structure or a warpage retainer to control flip chip warpage and eliminate shorts, open circuits, or functionality failures of electrical connectors connecting circuitry of the flip chip with a next level of integration or a carrier.

Figure 7:
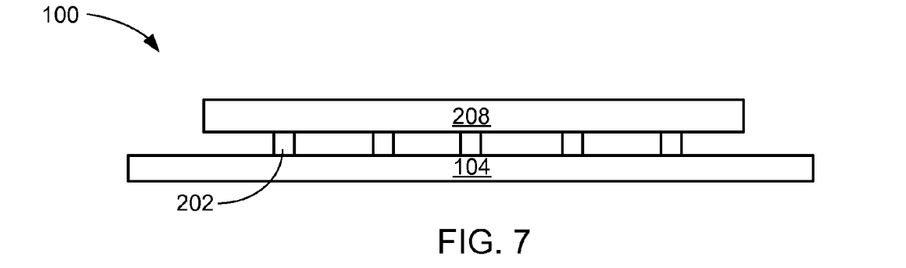
FIG. 7 is a cross-sectional view of the integrated circuit packaging system of FIG. 2 in an assembly placement phase.

Referring now to FIG. 7, therein is shown a cross-sectional view of the integrated circuit packaging system 100 of FIG. 2 in an assembly placement phase. The component connectors 202 of the integrated circuit device 208 can be mounted or positioned over the carrier 104 using an assembly placement process. The assembly placement process can include a cleaning process, an alignment process, and an assembly fixture (not shown).

Figure 8:
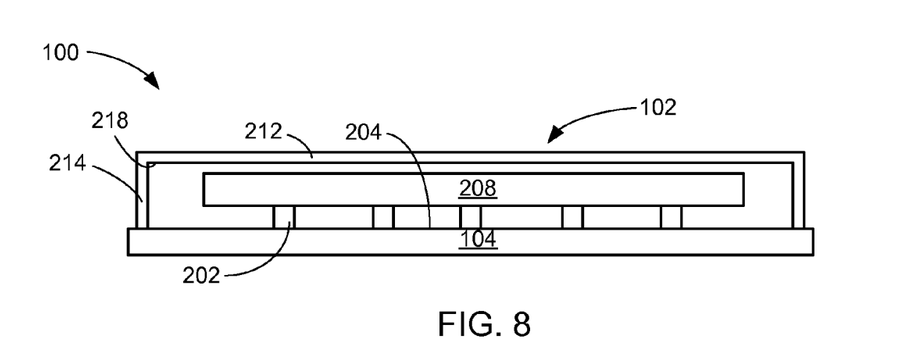
FIG. 8 is the cross-sectional view of FIG. 7 in a cover phase.

Referring now to FIG. 8, therein is shown the cross-sectional view of FIG. 7 in a cover phase. The restraint structure 102 is mounted or placed over the integrated circuit device 208 with the inner confinement surface 218 of the cover lid 212 or frame physically separated from the integrated circuit device 208 using a cover placement process.

The restraint structure 102 is placed or held in a rest position on the component side 204 using a force. The force can be a result of the weight of the restraint structure 102, the external weight applied to the restraint structure 102, the electromagnetic force applied to the restraint structure 102, the fastened force, or any combination thereof.

It has been discovered that the force can be applied with precision to prevent warpage induced open circuit failures and shorted circuits.

Figure 9:
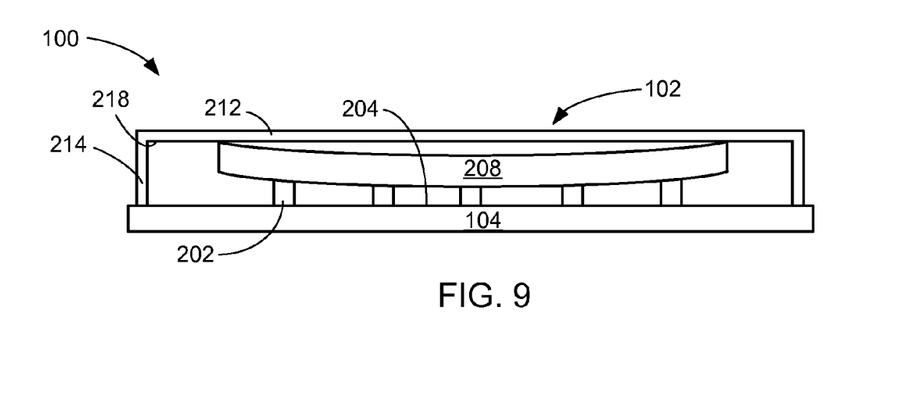
FIG. 9 is the cross-sectional view of FIG. 8 in a reflow phase.

Referring now to FIG. 9, therein is shown the cross-sectional view of FIG. 8 in a reflow phase. The component connectors 202 of the integrated circuit device 208 are attached to the carrier 104 during a reflow or bonding process. The integrated circuit device 208 is deformed or warped as a result of the reflow process during the reflow phase. Any warpage of the integrated circuit device 208 results in a direct contact of the inner confinement surface 218 with the integrated circuit device 208 before the threshold warpage 510 of FIG. 5 is attained.

The force acting on the cover lid 212 or frame prevents separation or lifting of the integrated circuit device 208 from the carrier 104 resulting in all of the component connectors 202 having continued connectivity between the integrated circuit device 208 and the carrier 104. The force acting on the cover lid 212 or frame also limits or control the warpage of the integrated circuit device 208 and minimizes any strain or compression of the component connectors 202.

Figure 10:
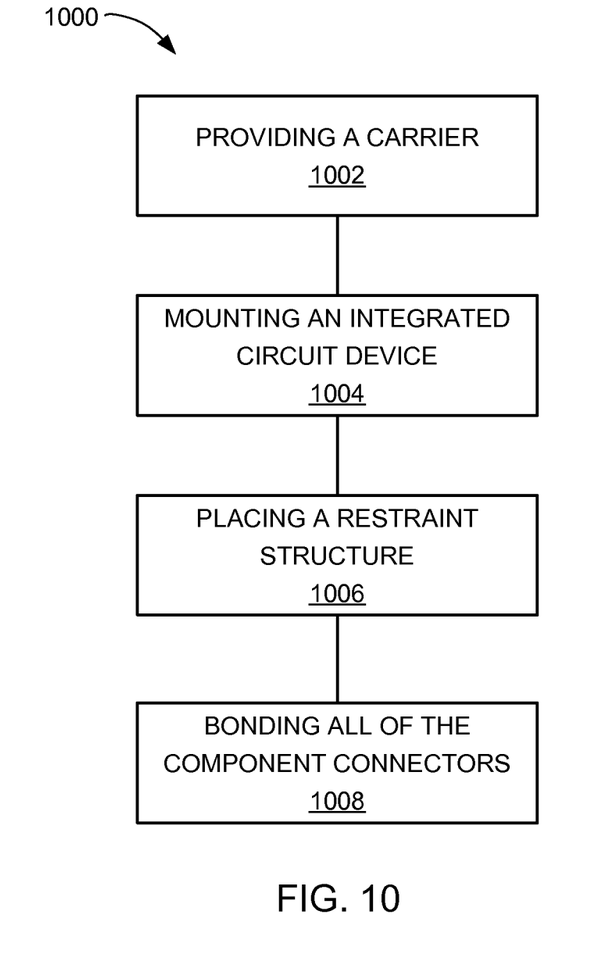
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: providing a carrier in a block 1002; mounting an integrated circuit device having component connectors directly on the carrier in a block 1004; placing a restraint structure over the integrated circuit device for controlling warpage of the integrated circuit device during bonding of the component connectors to the carrier causing some of the component connectors to separate from the carrier in a block 1006; and bonding all of the component connectors to the carrier in a block 1008.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
    providing a carrier;
    mounting an integrated circuit device having component connectors directly on the carrier;
    placing a restraint structure over the integrated circuit device, wherein placing the restraint structure includes placing ends of the restraint structure in a channel of the carrier, wherein the restraint structure controls warpage of the integrated circuit device during bonding of the component connectors to the carrier and prevents separation of the component connectors from the carrier; and
    bonding all of the component connectors to the carrier; and
    wherein the integrated circuit device has contact marks from contacting the restraint structure on an upper most edge of the integrated circuit device.

2. The method as claimed in claim 1 wherein the restraint structure comprises a cover lid having an inner cover height based on a threshold warpage.

3. The method as claimed in claim 1 wherein bonding all of the component connectors includes holding the restraint structure by weight of the restraint structure.

4. The method as claimed in claim 1 wherein bonding all of the component connectors includes holding the restraint structure by electromagnetic force.

5. The method as claimed in claim 1 wherein bonding all of the component connectors includes holding the restraint structure by fastened force.

6. A method of manufacture of an integrated circuit packaging system comprising:
    providing a carrier;
    mounting an integrated circuit device having component connectors directly on the carrier;
    placing a restraint structure over the integrated circuit device, wherein placing the restraint structure includes placing ends of the restraint structure in a channel of the carrier, wherein the restraint structure controls warpage of the integrated circuit device during bonding of the component connectors to the carrier and prevents separation of the component connectors from the carrier;

bonding all of the component connectors to the carrier, wherein during said bonding of all component connectors to the carrier, the restraint structure is in direct contact with the integrated circuit device and the integrated circuit device has contact marks from contacting the restraint structure on an upper most edge of the integrated circuit device.

7. The method as claimed in claim 6 further comprising removing the restraint structure from the carrier.

8. The method as claimed in claim 6 wherein the restraint structure comprises a cover lid.

9. The method as claimed in claim 6 wherein placing the restraint structure includes placing the restraint structure such that the restraint structure is separated from the integrated circuit device.

10. An integrated circuit packaging system comprising:
a carrier; and
an integrated circuit device having all component connectors bonded to the carrier, the integrated circuit device has contact marks from contacting a restraint structure on an upper most edge of the integrated circuit device, wherein the restraint structure includes ends of the restraint structure in a channel of the carrier, and the restraint structure controls warpage of the integrated circuit device and prevents separation of the component connectors from the carrier.

11. The system as claimed in claim 10 wherein the restraint structure comprises a cover lid having an inner cover height based on a threshold warpage.

12. The system as claimed in claim 10 wherein the restraint structure is held by weight of the restraint structure.

13. The system as claimed in claim 10 wherein the restraint structure is held by electromagnetic force.

14. The system as claimed in claim 10 wherein the restraint structure is held by fastened force.

15. The system as claimed in claim 10 wherein all of the component connectors are adjacent to the carrier with the restraint structure in direct contact with the integrated circuit device.

16. The system as claimed in claim 15 wherein the integrated circuit device includes the integrated circuit device having the contact marks on an inactive side of the integrated circuit device.

17. The system as claimed in claim 15 wherein the restraint structure includes the restraint structure separated from the integrated circuit device.

18. The system as claimed in claim 15 wherein the restraint structure comprises a cover lid directly on the integrated circuit device.

\* \* \* \* \*